United States Patent [19]

Moore

[11] 4,119,458

[45] Oct. 10, 1978

[54] METHOD OF FORMING A SUPERALLOY

[75] Inventor: Warren F. Moore, Schenectady, N.Y.

[73] Assignee: General Electric Company, Schenectady, N.Y.

[21] Appl. No.: 851,493

[22] Filed: Nov. 14, 1977

[51] Int. Cl.$^2$ ................................................ C22C 1/03
[52] U.S. Cl. ........................................ 75/170; 75/171
[58] Field of Search ........................... 75/170, 171, 82

[56] References Cited

U.S. PATENT DOCUMENTS

| | | | |
|---|---|---|---|
| 3,904,402 | 9/1975 | Smashey | 75/170 |
| 3,944,416 | 3/1976 | Walter | 75/170 |

*Primary Examiner*—R. Dean
*Attorney, Agent, or Firm*—F. Wesley Turner; Joseph T. Cohen; Charles T. Watts

[57] ABSTRACT

A method of forming a regular solution secondary eutectic nickel-base or cobalt-base superalloy—which contains, on a weight basis, 2–9% rhenium and less than about 0.8% titanium, and optionally an element selected from the group consisting of chromium, aluminum, tantalum, carbon, nickel, cobalt, tungsten, vanadium, molybdenum, niobium, hafnium, zirconium and boron—which comprises combining at a temperature above the eutectic melt temperature of the superalloy (1) a primary eutectic nickel-base or cobalt-base superalloy scrap containing, on a weight basis, 2–9% rhenium, and less than about 0.8% titanium, and optionally said elements; (2) a first master alloy containing the elements nickel, aluminum, vanadium, and carbon; (3) a second master alloy containing the elements nickel and carbon, and (4) elements selected from the group consisting of rhenium, titanium, chromium, aluminum, tantalum, nickel, cobalt, tungsten, molybdenum, niobium, hafnium, zirconium and boron including combinations thereof in alloy form.

10 Claims, No Drawings

METHOD OF FORMING A SUPERALLOY

CROSS REFERENCE TO RELATED APPLICATIONS

This invention is related to subject matter disclosed in U.S. Pat. Nos. 3,904,402, issued Sept. 9, 1975 to Russell W. Smashey; and 3,944,416, issued Mar. 16, 1975 to John L. Walter.

BACKGROUND OF THE INVENTION

Field of the Invention

This invention relates to a method of forming a regular solution secondary eutectic nickel- or cobalt-base superalloy — which contains, on a weight basis, 2–9% rhenium, less than about 0.8% titanium, and optionally an element selected from the group consisting of chromium, aluminum, tantalum, carbon, nickel, cobalt, tungsten, vanadium, molybdenum, niobium, hafnium, zirconium and boron — which comprises combining at a temperature above the eutectic melt temperature of the superalloy (1) a primary eutectic nickel-base superalloy scrap containing, on a weight basis, 2–9% rhenium, and less than about 0.8% titanium, and optionally said elements; (2) a first master alloy containing the elements nickel, aluminum, vanadium, and carbon; (3) a second master alloy containing the elements nickel and carbon, and (4) elements selected from the group consisting of rhenium, titanium, chromium, aluminum, tantalum, nickel, cobalt, tungsten, molybdenum, niobium, hafnium, zirconium and boron including combinations thereof in alloy form.

Nickel and cobalt base eutectic alloys which can be unidirectionally solidified in the production of metallic composites containing aligned fibers as a reinforcing phase of the superalloy matrix are advantageously employed in gas turbine engines because of their improved high temperature performance characteristics. The cost of such superalloy compositions which contain expensive pure alloy elements, such as rhenium requires that substantially all superalloy casting scrap generated during the formation of the primary superalloy ingot from pure alloying elements, as well as scrap, e.g. gates, risers, etc., generated during the production of the directionally solidified end product, must be remelted to form secondary alloys and be reused. The melt procedure suited to the preparation of the primary eutectic superalloy employed in my invention are not suited to remelt procedures utilizing primary alloy scrap for a portion of the raw materials of a secondary eutectic superalloy because of objectionable molten metal-crucible reactions, i.e. reactions in the liquidus solidus chemistry of eutectic melts during homogenization of eutectic alloys, caused by the presence of such reactive elements as carbon, aluminum, vanadium, etc., in the scrap material which are not normally a part of the initial furnace charge during a virgin melt. These undesirable reactions are related to melt problems such as (1) dissolved gases, e.g. oxygen, etc., (2) dissolved nongaseous elements, e.g. rhenium and tungsten, (3) suspended oxides, e.g. alumina, etc., and (4) inclusions including indigenous, e.g. tantalum carbide, etc., as well as exogeneous impurities.

DESCRIPTION OF THE INVENTION

This invention embodies a method of forming a regular solution secondary eutectic nickel- or cobalt-base superalloy — which contains, on a weight basis, 2–9% rhenium and less than about 0.8% titanium, and optionally an element selected from the group consisting of chromium, aluminum, tantalum, carbon, nickel, cobalt, tungsten, vanadium, molybdenum, niobium, hafnium, zirconium and boron — which comprises combining at a temperature above the eutectic melt temperature of the superalloy (1) a primary eutectic nickel-base or cobalt-base superalloy scrap containing, on a weight basis, 2–9% rhenium, and less than about 0.8% titanium, and optionally said elements; (2) a first master alloy containing the elements nickel, aluminum, vanadium, and carbon; (3) a second master alloy containing the elements nickel and carbon, and (4) elements selected from the group consisting of rhenium, titanium, chromium, aluminum, tantalum, nickel, cobalt, tungsten, molybdenum, niobium, hafnium, zirconium and boron including combinations thereof in alloy form.

Any nickel- or cobalt-base superalloy which contains rhenium, a transition metal and carbon and which when unidirectionally solidified forms an aligned transition metal carbide reinforcing fibrous phase can be employed. The presence of transition metal carbides, such as tantalum and/or vanadium, which are a part of the remelt scrap of the primary superalloy requires a high remelt process temperature range in order to resolution the carbides during transformation from a solidus to liquidus state. A high process temperature range is also necessary in order to facilitate the homogenization in the liquidus state of heavy alloy elements, e.g. tantalum, tungsten and/or rhenium. During the dissolution of carbides, e.g. carbide fibers into the secondary superalloy melt, the remelt scrap and master alloys are heated to temperatures above eutectic melt temperatures, e.g. 1350° C. to 1650° C., required for homogenization of the melt composites, e.g. elements and alloys used during formation of a desired eutectic compositions. This necessity for high remelt temperatures would contribute, except for the practice of this invention, to the formation of deleterious oxide slag films, such as aluminum oxide and vanadium oxide during the remelt process. Further, the heretofore unresolved associated high temperature related problem, i.e. the occurrence of oxide films when remelting primary alloy scrap which has heretofore prevented the addition of carbon and/or vanadium in elemental form during remelt of a primary eutectic superalloy scrap, is solved by the use of my master alloys in the practice of my invention.

The master alloys employed in my invention are nickel or cobalt combined with carbon or carbon, aluminum and vanadium or any other transition metal which is reactive with oxygen derived from any refractory container employed in the preparation of a secondary superalloy melt.

Any refractory material can be employed in the preparation of the remelt secondary alloy wherein the containers are substantially free of silica, e.g. contain less than about 5% silica by weight. Presently preferred refractories comprise substantially high purity magnesium oxide because of economics. Other suitable refractory containers include aluminum oxide, stabilized zirconium oxide and combinations of magnesium oxide and aluminum oxide in fused or brick form.

My invention is more clearly understood from the following description of the best mode of making a preferred embodiment of my invention — a nickel-tantalum carbide ingot suited to the unidirectional solidification of an aircraft engine part which is exceptionally resistant to high temperature stress rupture at the elevated temperatures conventionally used in aircraft engine operations.

A primary nickel-base alloy — hereafter designated as AG-3 — was initially produced by adding, on a weight basis, the following elements: 64.5% Ni, 6.7% Re, 4.0% Co, 3.95% Cr, 3.20% W, 5.5% Al, 5.55% V, 6.30% Ta and 0.29% C according to the procedure set out hereafter:

The procedure for making a virgin melt of AG-3 was as follows:

(1) Ni, Co, Cr, W, Re and Ta were charged together in a magnesia crucible in a closed evacuated chamber. Melting was then accomplished in a dynamic partial pressure atmosphere of hydrogen.

(2) After the initial element charge was molten, the melt was allowed to solidify and the $H_2$ was pumped out of the chamber and out of the melt by evacuation of the chamber.

(3) The resulting solidified charge was remelted in vacuum and the remainder of the $H_2$ pumped from the melt.

(4) Argon was admitted to the chamber until the chamber reached atmospheric pressure.

(5) Carbon was added to the melt and allowed to dissolve completely.

(6) The surface of the resulting melt was extremely clean and free of any oxide skin. A 85% V-15% Al alloy and Al were added to this clean surface and they dissolved readily into the melt.

(7) The melt temperature was brought to approximately 1600° C. and the heat was poured into a suitable mold.

EXAMPLE I

Approximately 591 grams of scrap produced during the directional solidification of the AG-3 alloy prepared according to the procedures set out above was combined with the required quantity of virgin materials and two master alloys — prepared according to the procedures described hereafter — in the preparation of a regular solution secondary eutectic superalloy suitable for aircraft engine parts defined herein as NiTaC-13 having a composition, on a weight basis, as follows: 63.62% Ni, 3.30% Co, 4.40% Cr, 3.20% W, 5.30% Al, 6.20% Re, 5.40% V, 8.10% Ta and 0.48% C.

The AG-3 scrap was converted to NiTaC-13 ingot according to the following melt procedure:

(1a) A charge containing, on a weight basis, 25.41 gms. Ni, 2.1 gms. Co, 10.98 gms. Cr, 6.05 gms. W, 7.41 gms. Al, 8.76 gms. Re, 25.95 gms. Ta, and 591 grams AG-3 scrap was melted in a magnesia crucible in argon at atmospheric pressure.

(2a) 21.43 grams of a master Ni-V-Al-C alloy containing on a weight basis: 43.5% V, 6.65% Al, 1.1% C, Bal. Ni, and 81.08 grams of a master Ni-C alloy containing on a weight basis 2.22% C, were added to the melt and both dissolved readily. The master alloys penetrated the AG-3 scrap oxide slag film and were not suspended upon the top of the slag — a suspension occurrence which had previously occurred during attempted additions of elemental C and a vanadium and aluminum master alloy, i.e. 85% V-15% Al, to an unsuccessful NiTaC-13 remelt method utilizing AG-3 scrap.

(3a) After the master alloy additions were dissolved, the melt temperature was raised to approximately 1600° C. and the resulting NiTaC-13 alloy was poured into a suitable mold.

An option to the procedure — set out above — for the preparation of a NiTaC-13 alloy is as follows:

(1b) The same amounts as in (1a and 2a) above were added in the following sequence in order to prepare a NiTaC-13 remelt ingot.

1. Ni, Co, Cr, W, Re, Ta, AG-3 scrap, Ni-C alloy and Ni-V-Al-C alloy were melted in MgO crucible in argon at atmospheric pressure.
2. The melt was heated to approximately 1600° C. and poured into a suitable mold.

EXAMPLE II

The Ni-V-Al-C master alloy employed in the procedures of Example I above, was prepared accordingly:

A Ni-V-Al-C master alloy containing, on a weight basis, 43.5% V, 6.65% Al, 1.1% C and the balance of Ni was prepared in a vacuum induction melting furnace in a refractory crucible prepared from MgO, $Al_2O_3$ or stabilized $ZrO_2$. A charge consisting of substantially pure nickel (270 grade) was melted in the furnace chamber in argon at atmospheric pressure. ECV grade high purity elemental carbon was added to the melt. After all the carbon was dissolved, a master alloy consisting, on a weight basis, of 85% V-15% Al was added to the Ni and C melt. When the V-Al alloy was dissolved and the charge was completely molten and homogeneous, the melt was poured into a chill mold and used as a master alloy as described hereinbefore.

EXAMPLE III

The Ni-C master alloy employed in the procedures of Example I above, was prepared accordingly:

A Ni-C master alloy containing, on a weight basis, 2.22% C was prepared in a vacuum induction melting furnace in a refractory crucible prepared from MgO, $Al_2O_3$ or stabilized $ZrO_2$. A charge consisting of substantially pure nickel (270 grade) was melted in the furnace chamber in argon at atmospheric pressure. ECV grade high purity elemental carbon was added to the melt. When the C was all dissolved and the charge was completely molten and homogeneous, the melt was poured into a chill mold and used as a master alloy as described hereinbefore.

I claim:

1. A method of forming a regular solution secondary eutectic nickel-base or cobalt-base superalloy — which contains, on a weight basis, 2-9% rhenium and less than about 0.8% titanium, and optionally an element selected from the group consisting of chromium, aluminum, tantalum, carbon, nickel, cobalt, tungsten, vanadium, molybdenum, niobium, hafnium, zirconium and boron — which comprises combining at a temperature above the eutectic melt temperature of the superalloy (1) a primary eutectic nickel-base or cobalt-base superalloy scrap containing, on a weight basis, 2-9% rhenium, and less than about 0.8% titanium, and optionally said elements; (2) a first master alloy containing the elements nickel, aluminum, vanadium, and carbon; (3) a second master alloy containing the elements nickel and carbon, and (4) elements selected from the group consisting of rhenium, titanium, chromium, aluminum, tantalum, nickel, cobalt, tungsten, molybdenum, niobium, hafnium, zirconium and boron including combinations thereof in alloy form.

2. The claim 1 method, wherein said combining is carried out in the presence of an oxidant.

3. The claim 1 method, wherein the method is carried out in a refractory container substantially free of silica.

4. The claim 1 method, wherein said refractory container is substantially pure magnesium oxide, aluminum oxide, including mixtures thereof, or stabilized zirconium oxide.

5. The claim 1 method, wherein said temperature is from 1350° C. to 1650° C.

6. The claim 1 method, wherein said temperature is at least 1600° C. for a time period of at least 1 minute.

7. The claim 1 method, wherein said primary superalloy is a unidirectionally solidified anisotropic metallic composite body comprising:

a matrix of nickel- or cobalt-base superalloy consisting essentially of, on a weight basis, about 2–9% Re and less than about 0.8% Ti, along with elements selected from the group consisting of Cr, Al, Ta, C, Ni, Co, W, V, Mo, Cb, Hf, Zr, and B, the matrix being a solid solution; and an aligned eutectic reinforcing fibrous phase selected from carbides of the group consisting of Ta, V and their alloys and mixtures embedded in the matrix.

8. The claim 7 method, wherein the eutectic carbide reinforcing fibrous phase is predominantly TaC.

9. The claim 7 method, wherein the eutectic carbide reinforcing fibrous phase is predominantly TaVC.

10. The claim 9 method, wherein said alloy contains on a weight basis 69.46% Ni, 6.30% Re, 1.90% Cr, 6.50% Al, 8.00% Ta, 0.24% C, 3.70% Co, and 3.90% V.